(12) United States Patent
Mojumder et al.

(10) Patent No.: US 9,542,518 B2
(45) Date of Patent: Jan. 10, 2017

(54) USER EXPERIENCE BASED MANAGEMENT TECHNIQUE FOR MOBILE SYSTEM-ON-CHIPS

(71) Applicant: QUALCOMM Incorporated, San Diego, CA (US)

(72) Inventors: Niladri Narayan Mojumder, San Diego, CA (US); Stanley Seungchul Song, San Diego, CA (US); Kern Rim, San Diego, CA (US); Choh Fei Yeap, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 42 days.

(21) Appl. No.: 14/656,426

(22) Filed: Mar. 12, 2015

(65) Prior Publication Data

US 2016/0140275 A1   May 19, 2016

Related U.S. Application Data

(60) Provisional application No. 62/080,720, filed on Nov. 17, 2014.

(51) Int. Cl.
*G06F 17/50* (2006.01)
*G06F 15/76* (2006.01)

(52) U.S. Cl.
CPC ........... *G06F 17/5045* (2013.01); *G06F 15/76* (2013.01)

(58) Field of Classification Search
CPC .................................................. G06F 17/5045
USPC ........................................................ 716/138
See application file for complete search history.

(56) References Cited

U.S. PATENT DOCUMENTS

| | | | |
|---|---|---|---|
| 6,438,037 B1* | 8/2002 | Fastow | G11C 16/3404 365/185.22 |
| 6,788,985 B2* | 9/2004 | Mitsutake | G06Q 30/0601 700/291 |
| 7,296,175 B2 | 11/2007 | Augsburg et al. | |
| 7,500,204 B2* | 3/2009 | Pineda De Gyvez | G06F 1/3203 713/323 |
| 7,941,332 B2* | 5/2011 | Liu | G06F 9/5083 705/7.11 |
| 8,037,437 B2 | 10/2011 | Davis et al. | |
| 8,850,373 B2* | 9/2014 | Hibbeler | G06F 17/5045 716/108 |
| 8,887,118 B2* | 11/2014 | Hibbeler | G06F 17/5045 716/133 |
| 8,924,898 B2* | 12/2014 | Killian | G06F 17/5045 712/1 |
| 9,041,126 B2* | 5/2015 | Hoffmann | H01L 29/7833 257/402 |
| 9,043,060 B2* | 5/2015 | Sujan | B60W 10/06 701/22 |

(Continued)

FOREIGN PATENT DOCUMENTS

CA    2726091 A1    6/2012

*Primary Examiner* — Sun Lin
(74) *Attorney, Agent, or Firm* — Toler Law Group, PC

(57) ABSTRACT

A method for designing a system-on-chip (SOC) for a wireless device includes receiving, at a design processor, first usage conditions for a first module of the SOC and second usage conditions for a second module of the SOC. The method further includes determining design parameters for the SOC. The design parameters are determined based on the first usage conditions and the second usage conditions.

20 Claims, 7 Drawing Sheets

(56) References Cited

U.S. PATENT DOCUMENTS

| | | | |
|---|---|---|---|
| 2010/0281245 A1* | 11/2010 | Pessolano | G06F 1/3203 |
| | | | 713/100 |
| 2012/0036375 A1 | 2/2012 | Puschini et al. | |
| 2014/0189377 A1 | 7/2014 | Subbareddy et al. | |
| 2016/0092363 A1* | 3/2016 | Wang | G06F 12/0842 |
| | | | 711/119 |
| 2016/0142054 A1* | 5/2016 | Mojumder | G06F 1/3206 |
| | | | 327/333 |

* cited by examiner

| | Operating Frequency | Execution Time |
|---|---|---|
| First Module | 1.45 GHz | 4 Hours |
| | 1.92 GHz | 2 Hours |
| | 2.25 GHz | 1 Hour |
| | 2.5 GHz | 0.5 Hours |
| Second Module | 800 MHz | 8 Hours |
| Third Module | 450 MHz | 18 Hours | ns
USER EXPERIENCE BASED MANAGEMENT TECHNIQUE FOR MOBILE SYSTEM-ON-CHIPS

I. CLAIM OF PRIORITY

The present application claims priority from U.S. Provisional Patent Application No. 62/080,720, entitled "USER EXPERIENCE BASED HOLISTIC MANAGEMENT TECHNIQUE FOR MOBILE SYSTEM-ON-CHIPS," filed Nov. 17, 2014, the contents of which are incorporated by reference in their entirety.

II. FIELD

The present disclosure is generally related to a system-on-chip (SOC) for a mobile device.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), tablet computers, and paging devices that are small, lightweight, and easily carried by users. Many such computing devices include other devices that are incorporated therein. For example, a wireless telephone can also include a digital still camera, a digital video camera, a digital recorder, and an audio file player. Also, such computing devices can process executable instructions, including software applications, such as a web browser application that can be used to access the Internet and multimedia applications that utilize a still or video camera and provide multimedia playback functionality.

A wireless device may include a system-on-chip (SOC) that integrates multiple components, modules, and/or processors. As a non-limiting example, the SOC may include a central processing unit (CPU), a graphics processing unit (GPU), a digital signal processor (DSP), a modulator/demodulator (modem), a display module, etc. The operating frequency and usage time for each component of the SOC may vary based on an individual user experience (e.g., based on whether an individual user uses a wireless device for texting, phone calls, music, gaming, etc.). For example, a first user may purchase a first wireless device and use the first wireless device primarily for communications purposes (e.g., texting and phone calls). A second user may purchase a second wireless device (having the same SOC architecture as the first wireless device) and use the second wireless device primarily for music and gaming purposes.

Designing the hardware for each wireless device (e.g., the first and second wireless device) to have similar characteristics (e.g., transistor threshold voltages and/or transistor channel lengths) may reduce energy efficiency. As a non-limiting example, increasing the transistor threshold voltages to speed up a CPU may lead to increased battery energy drain. If the CPU executes for a relatively small fraction of time (e.g., the CPU is rarely used), the battery energy drain caused by increasing the transistor threshold voltages may be a poor tradeoff for increased CPU speed. The amount of time that the CPU executes may be dependent on the usage of a particular wireless device (e.g., dependent on a user experience). For example, the second user may use the CPU on the second wireless device for a greater amount of time than the first user uses the CPU on the first wireless device (e.g., music and gaming requires more CPU usage than texting and phone calls).

IV. SUMMARY

Techniques for designing a system-on-chip (SOC) for a mobile device based on a planned user experience are disclosed. For example, a design processor (e.g., a design engine) may determine design parameters for a SOC to be integrated into a mobile phone. The design parameters may indicate a threshold voltage for one or more transistors in the SOC and/or a channel length for one or more transistors in the SOC. To determine the design parameters, planned usage conditions for the SOC may be provided to the design processor. For example, the SOC may be designed to include multiple modules (e.g., processors). The planned usage conditions may indicate the amount of time that each module is predicted to operate during a battery life of the mobile phone.

To illustrate, the SOC may include a first module (e.g., a digital signal processor (DSP)) and a second module (e.g., a central processing unit (CPU)). To determine the design parameters for the SOC, the design processor may receive planned usage conditions that indicate the frequencies that the first module is anticipated to operate (and how long the first module is to operate at each frequency) and indicate the frequencies that the second module is anticipated to operate (and how long the second module is to operate at each frequency). By providing the planned usage conditions (e.g., the operating frequencies and corresponding usage times for different modules of the SOC), the design processor may generate a design output that is based on planned usage conditions. Thus, the design processor may generate a design output that indicates transistor parameters (e.g., threshold voltages and channel lengths) to improve performance based on the user experience.

In a particular aspect, a method for designing a system-on-chip (SOC) for a wireless device includes receiving, at a design processor, first usage conditions for a first module of the SOC and second usage conditions for a second module of the SOC. The method further includes determining design parameters for the SOC. The design parameters are based on the first usage conditions and the second usage conditions.

In another particular aspect, an apparatus includes a design processor and a memory storing instructions executable by the design processor to perform operations. The operations include receiving first usage conditions for a first module of a system-on-chip (SOC) for a wireless device and second usage conditions for a second module of the SOC. The operations further include determining design parameters for the SOC. The design parameters are based on the first usage conditions and the second usage conditions.

In another particular aspect, a non-transitory computer-readable medium includes instructions for designing a system-on-chip (SOC) for a wireless device. The instructions, when executed by a design processor, cause the design processor to receive first usage conditions for a first module of the SOC and second usage conditions for a second module of the SOC. The instructions are also executable to cause the design processor to determine design parameters for the SOC. The design parameters are based on the first usage conditions and the second usage conditions.

One particular advantage provided by at least one of the disclosed embodiments is an ability to design a system-on-chip (SOC) for a wireless device that is customized to a user experience. For example, a design processor may determine design parameters (e.g., transistor threshold voltages and transistor channel lengths) for the SOC to improve performance based on planned usage conditions (e.g., the user experience). Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
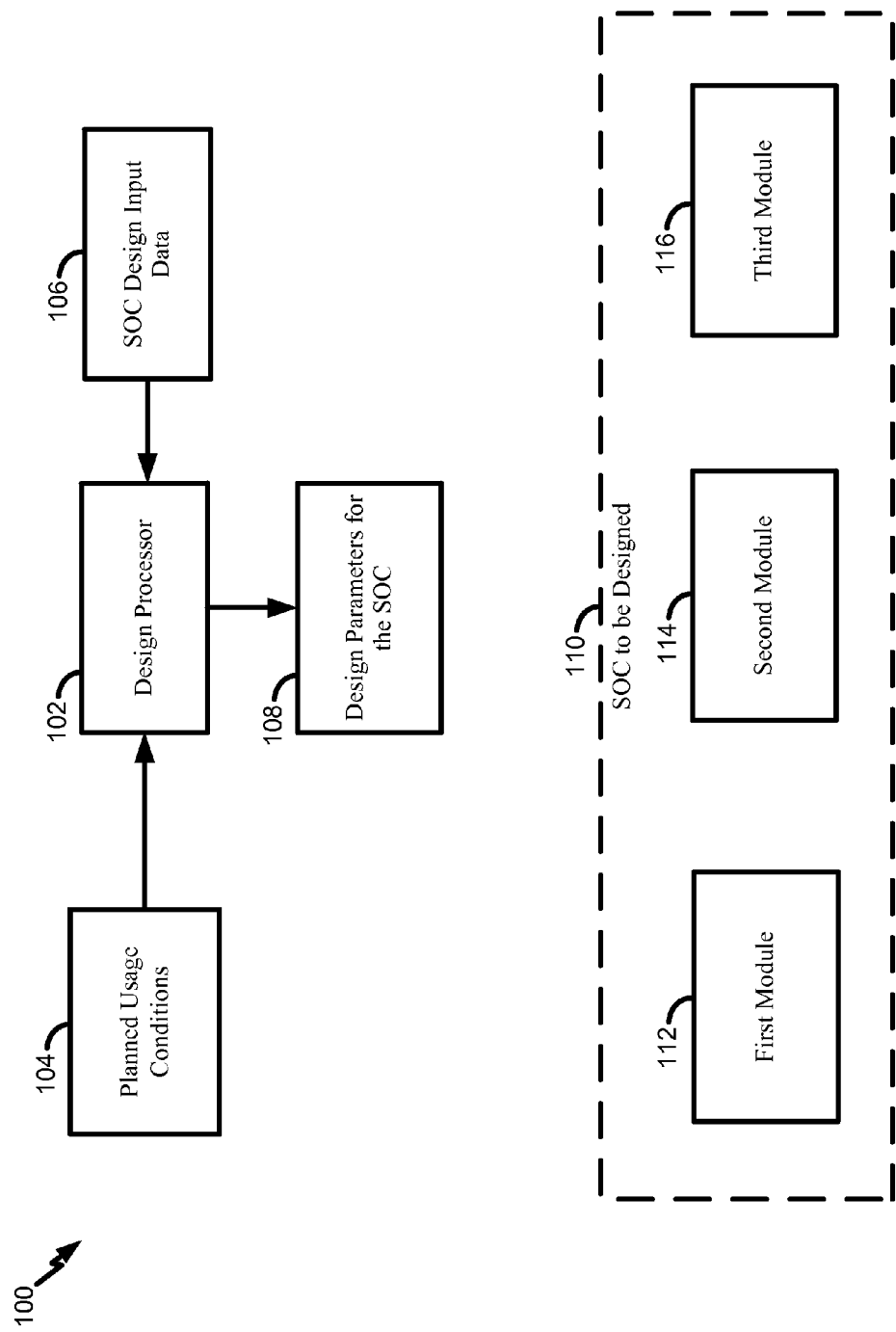
FIG. 1 is a diagram of a particular illustrative embodiment of a system that is operable to determine design parameters for a system-on-chip (SOC) for a wireless device.

Referring to FIG. 1, a particular illustrative embodiment of a system 100 that is operable to determine design parameters for a system-on-chip (SOC) for a wireless device is shown. For example, the system 100 includes a design processor 102 that is configured to determine design parameters 108 for a SOC 110 that is to be designed for a wireless device.

In the illustrative embodiment, the design processor 102 may be a transistor design engine. For example, the design processor 102 may determine design parameters 108 for transistors that are to be implemented in the SOC 110 to be designed. As non-limiting examples, the design parameters 108 may specify threshold voltages for transistors that are to be implemented in each module of the SOC 110, gate lengths for transistors that are to be implemented in each module of the SOC 110, on/off currents for transistors that are to be implemented in each module of the SOC 110, other parameters, or any combination thereof. In a particular embodiment, transistors in one module of the SOC 110 may have different characteristics, device architectures, and electrical property tuning characteristics (e.g., threshold voltages, channel lengths, on/off currents, supply voltages, etc.) than transistors in other modules of the SOC 110. As described below, the design parameters 108 may improve performance of the wireless device based on a planned user experience.

To determine the design parameters 108, the design processor 102 may receive planned usage conditions 104 for the SOC 110 to be designed and other SOC design input data 106. The other SOC design input data 106 is described in greater detail with respect to FIG. 4. The planned usage conditions 104 for the SOC 110 to be designed may indicate the amount of time that each module in the SOC 110 is predicted to operate at certain operating frequencies during a battery life of the wireless device (e.g., a time of operating the wireless device from a battery fully charged).

To illustrate, the SOC 110 to be designed may have a first module 112, a second module 114, and a third module 116. In a particular embodiment, the first module 112 is a central processing unit (CPU), the second module 114 is a digital signal processor (DSP), and the third module 116 is a modulator/demodulator (MODEM). Although three modules 112-116 are depicted in the SOC 110 to be designed, in other embodiments, the SOC 110 may include additional modules (or fewer modules). For example, the SOC 110 may also include a graphics processing unit (GPU), a display module, etc. The planned usage conditions 104 may indicate the amount of time each module 112-116 is predicted to operate at a particular frequency. As described below, the planned usage conditions may be based on a predicted user experience.

Figure 2:
FIG. 2 is a diagram of a particular illustrative embodiment of a table illustrating planned usage conditions.

Referring to FIG. 2, a table illustrating an example of planned usage conditions 104 is shown. For example, the planned usage conditions 104 may indicate that the first module 112 of the SOC 110 to be designed is to operate at approximately 1.45 Gigahertz (GHz) for four hours during a single battery life of the wireless device. The planned usage conditions 104 further indicate that the first module 112 of the SOC 110 to be designed is to operate at approximately 1.92 GHz for two hours during the single battery life of the wireless device. The planned usage conditions 104 also indicate that the first module 112 of the SOC 110 to be designed is to operate at approximately 2.25 GHz for one hour during the single battery life of the wireless device. Additionally, the planned usage conditions 104 indicate that the first module 112 of the SOC 110 to be designed is to operate at 2.5 GHz for half an hour during the single battery life of the wireless device.

The planned usage conditions 104 indicate that the second module 114 of the SOC 110 to be designed is to operate at 800 Megahertz (MHz) for eight hours during the single battery life of the wireless device. The planned usage conditions 104 also indicate that the third module 116 of the SOC 110 to be designed is to operate at 450 MHz for eighteen hours during the single battery life of the wireless device.

The operating frequency and execution time for the each module 112-116 in the planned usage conditions 104 may be based on a predicted user experience (e.g., based on a user profile). For example, a first user profile may correspond to a wireless device user that will use the wireless device primarily for communications purposes (e.g., texting, phone calls, emails, etc.), and a second user profile may correspond to a wireless device user that will use the wireless device primarily for music and gaming purposes.

Figure 3:
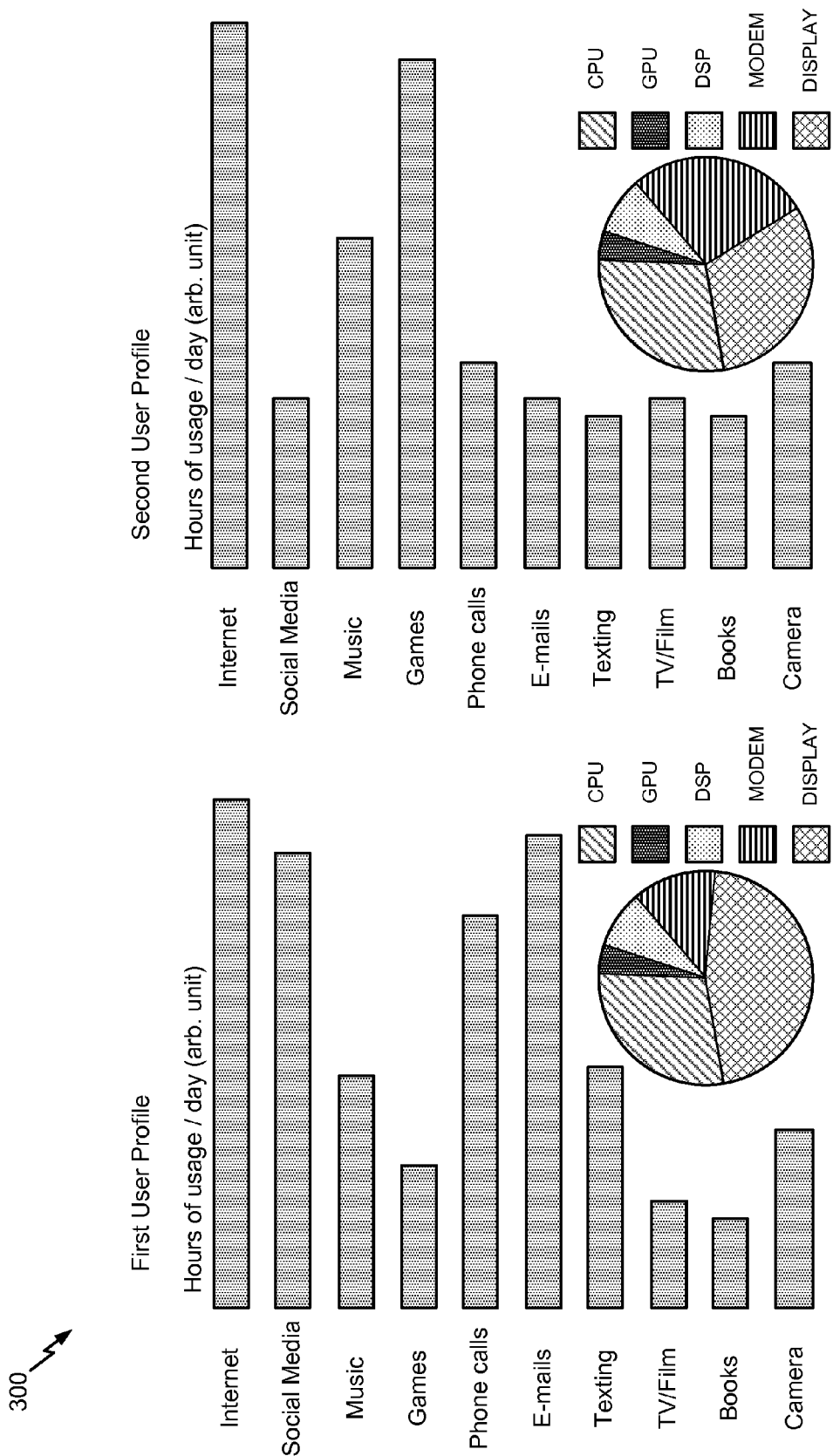
FIG. 3 is a diagram of a particular illustrative embodiment of a first user profile and a second user profile.

To illustrate, referring to FIG. 3, a particular illustrative embodiment 300 of a first user profile and a second user profile is shown. The first user profile indicates that the first user will primarily use the wireless device for phone calls, emails, texting, and social media purposes. The second user profile indicates that the second user will primarily use the wireless device for games and music. Based on the user profile, the operating frequency and usage time (e.g., run time) in the CPU, GPU, DSP, DISPLAY, and MODEM may change for an SOC. For example, the second user may use the CPU for a greater amount of time than the first user uses the CPU (e.g., music and gaming requires more CPU usage than texting and phone calls).

Thus, referring back to FIG. 1, the planned usage conditions 104 provided to the design processor 102 may be based on a predicted user experience (e.g., the first user profile of FIG. 3 or the second user profile of FIG. 3). If the planned usage conditions 104 are based on the first user profile, the design parameters 108 (e.g., the transistor parameters) may be configured (e.g., "optimized") to design an SOC 110 used primarily for phone calls, emails, texting, and social media purposes. If the planned usage conditions 104 are based on the second user profile, the design parameters 108 may be configured (e.g., "optimized") to design an SOC 110 used primarily for games and music. Design parameters 108 based on the first user profile may be used to design a first version of a wireless device, and design parameters 108 based on the second user profile may be used to design a second version of the wireless device. Each version of the wireless device may include similar components/modules (e.g., each version may correspond to a similar model of the wireless device).

As used herein, configuring (e.g., "optimizing") the design parameters 108 corresponds to determining transistor threshold voltages, transistor channel lengths, transistor on/off currents, fin lengths, contact poly pitch, or any combination thereof, for each module 112, 114, 116, that will increase energy efficiency of the SOC 110 based on the predicted user experience. For example, increasing the transistor threshold voltages of transistors in a CPU to speed up the CPU may lead to increased battery energy drain. If the CPU runs for a relatively small fraction of time (as in the case of the first user profile), the battery energy drain caused by increasing the transistor threshold voltages may be a poor tradeoff for the increased CPU speed. Thus, the design parameters 108 for the first user profile may indicate to design transistors having relatively small transistor threshold voltages for the CPU because the CPU is predicted to run for a relatively small fraction of time.

The system 100 of FIG. 1 may increase energy efficiency of the SOC 110 to be designed based on a predicted user experience. For example, by providing the planned usage conditions 104 to the design processor 102, the design processor 102 may determine design parameters 108 (e.g., transistor parameters) for the SOC 110 based on how long a user is likely to use a particular module 112-116 within the SOC 110 at a particular frequency. For example, the design processor 102 may generate the design parameters 108 based on first usage conditions (e.g., a first operating frequency of the CPU and the amount of time the CPU operates at the first operating frequency) and based on second usage conditions (e.g., a second operating frequency of the DSP and the amount of time the DSP operates at the second operating frequency). Thus, the design processor 102 may determine the design parameters 108 based on the tradeoff between energy drain (caused by increasing transistor threshold voltages and/or transistor channel lengths) and execution time. For example, if the planned usage conditions 104 indicate a relatively short execution time for a particular module, the design processor 102 may determine to decrease the transistor threshold voltages for the particular module to conserve energy. Generating the design parameters 108 based on the planned usage conditions 104 (e.g., the first usage conditions and the second usage conditions) may enable the design of different versions of a wireless device to increase energy efficiency based on an anticipated planned user experience.

Figure 4:
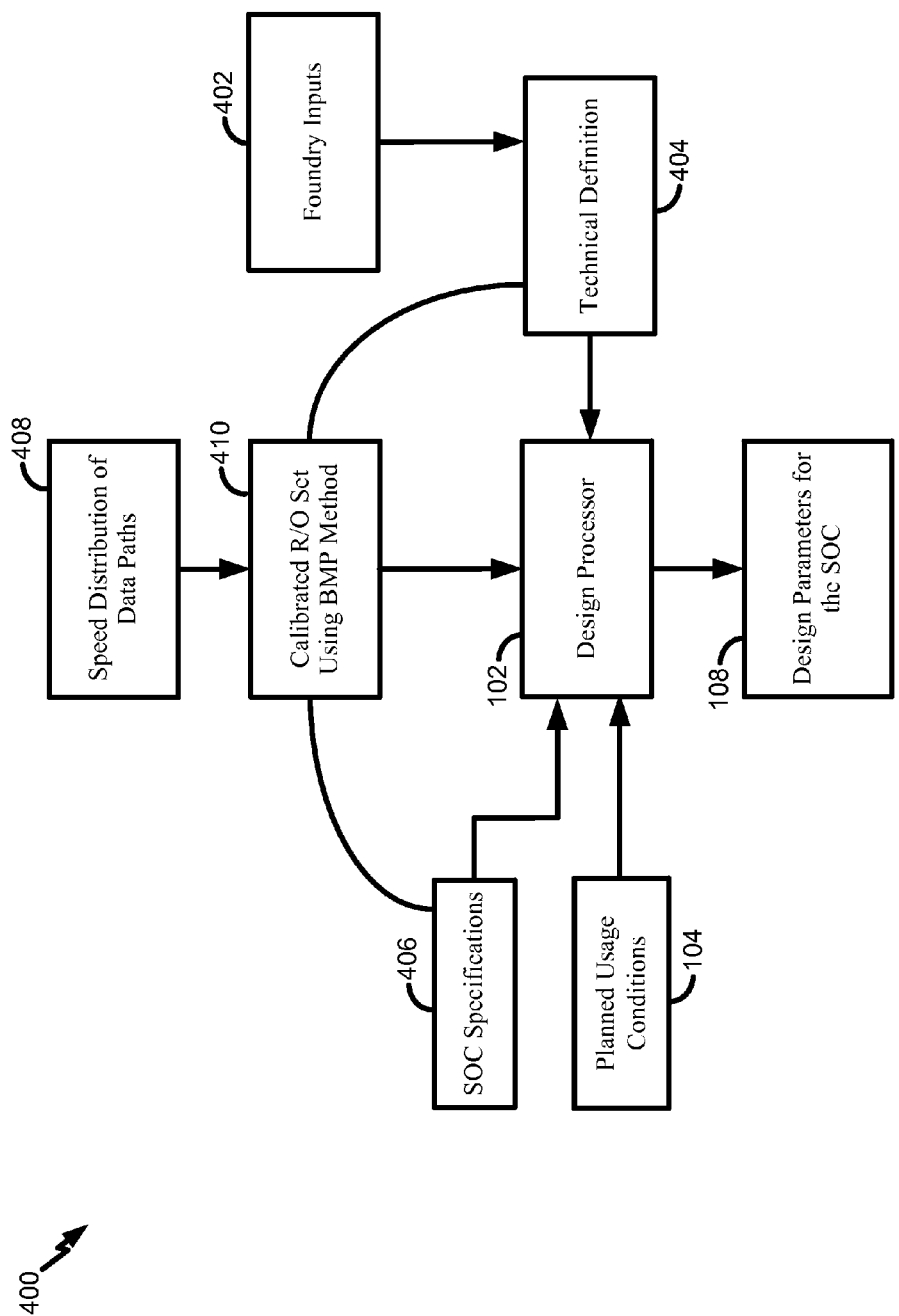
FIG. 4 is a diagram of another particular illustrative embodiment of a system that is operable to determine design parameters for a SOC for a wireless device.

Referring to FIG. 4, a particular illustrative embodiment of a system 400 that is operable to determine design parameters for a SOC for a wireless device is shown. The system 400 includes the design processor 102 of FIG. 1 that is configured to determine the design parameters 108 of the SOC 110 based on the planned usage conditions 104. The design processor 102 may also determine the design parameters 108 based on foundry inputs 402, a technical definition 404, specifications 406, a speed distribution 408 of data paths, and a calibrated ring oscillator (R/O) set 410 that is binned and mapped by path (BMP), as described below. In a particular embodiment, the foundry inputs 402, the technical definition 404, the specifications 406, the speed distribution 408, and the calibrated R/O set 410 may correspond to the other SOC design input data 106 of FIG. 1.

The foundry inputs 402 and the technical definition 404 may determine possible technologies (e.g., 20 nm designs, silicon-germanium (SiGe) designs, etc.) for the threshold voltages and gate lengths, on and off currents, and other parameters to design the overall SOC. In addition, the specifications 406, such as speed, power requirements, and other parameters, define the overall possibilities for the SOC design.

The system 400 considers the data paths that run through the SOC and divides the data paths (or a representative sample of the data paths) by the length of time taken to traverse the data paths. The speed distribution 408 of the data paths for the SOC, along with the specifications 406 and the technical definitions 404, are inputs to a set of devices. These devices (e.g., ring oscillators, logic gates, or other like devices) are binned and mapped by path (BMP) for a selected threshold voltage and gate length, at 410.

Once the power and/or speed for the data paths in the SOC are calibrated to a given part (e.g., ring oscillator, logic gate, etc.) and the planned usage conditions 104 are provided to the design processor 102 (as described with respect to FIGS. 1-3), the design processor 102 determines which transistors, and/or which data paths, within the SOC may use different threshold voltages, gate lengths, transistor on/off currents, and other parameters and may output a higher-performance SOC design as the design parameters 108 for the SOC 110 to be designed.

The system 400 of FIG. 4 may increase energy efficiency of the SOC 110 to be designed based on a predicted user experience. For example, by providing the planned usage conditions 104 to the design processor 102, the design processor 102 may determine design parameters 108 (e.g., transistor parameters) for each module 112-116 of the SOC 110 based on how long a user is likely to use a particular module 112-116 within the SOC 110 at a particular frequency. For example, the design processor 102 may generate the design parameters 108 based on first usage conditions (e.g., a first operating frequency of the CPU and the amount of time the CPU operates at the first operating frequency) and based on second usage conditions (e.g., a second operating frequency of the DSP and the amount of time the DSP operates at the second operating frequency). Generating the design parameters 108 based on the planned usage conditions 104 (e.g., the first usage conditions and the second usage conditions) may enable the design of different versions of a wireless device to improve performance based on an anticipated planned user experience.

Figure 5:
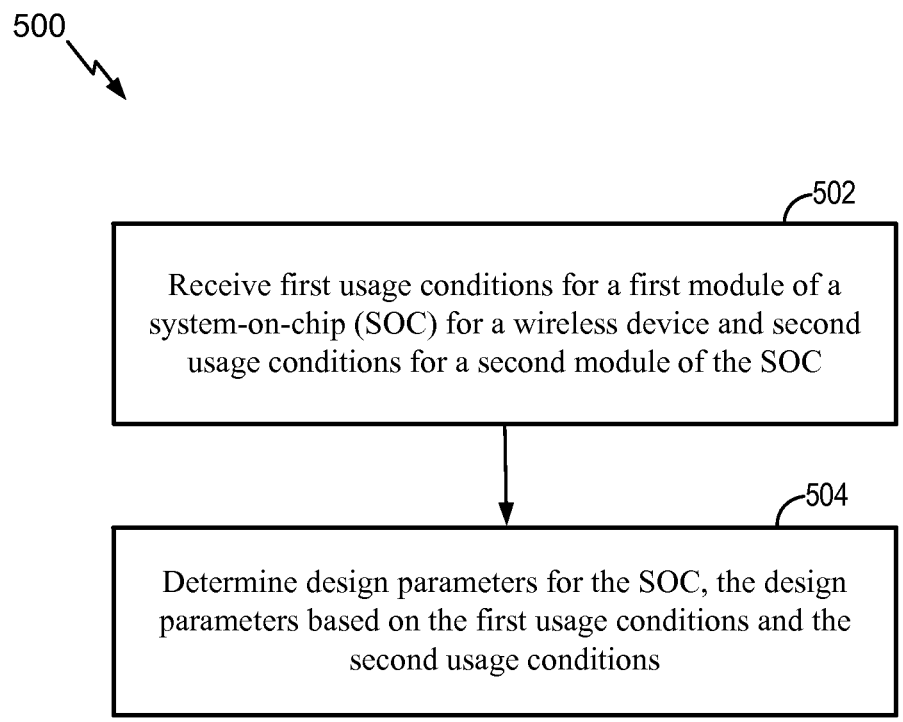
FIG. 5 is a flow chart of a particular illustrative embodiment of a method for determining design parameters for a SOC for a wireless device.

Referring to FIG. 5, a flowchart of another particular illustrative embodiment of a method 500 for determining design parameters for a SOC for a wireless device is shown. The method 500 may be performed using the design equipment described with respect to FIG. 7.

The method 500 includes receiving first usage conditions for a first module of a SOC for a wireless device and second usage conditions for a second module of the SOC, at 502. For example, referring to FIGS. 1-2, the design processor 102 may receive the planned usage conditions 104. The planned usage conditions may include first usage conditions for the first module 112 of the SOC 110 to be designed and second usage conditions for the second module 114 of the SOC 110.

The first usage conditions may correspond to a first operating frequency of the first module 112 and a first amount of time that the first module 112 operates at the first operating frequency. As a non-limiting example, referring to FIG. 2, the first usage conditions may specify that the first module 112 is predicted to operate at 1.45 GHz for four hours during the single battery life of the wireless device, to operate at 1.92 GHz for two hours during the single battery life, to operate at 2.25 GHz for one hour during the single battery life, and to operate at 2.5 GHz for half an hour during the single battery life.

The second usage conditions may correspond to a second operating frequency of the second module 114 and a second amount of time that the second module 114 operates at the second operating frequency. As a non-limiting example, referring to FIG. 2, the second usage conditions may specify that the second module 114 is predicted to operate at 800 MHz for eight hours during the single battery life of the wireless device.

In a particular embodiment, the method 500 may include receiving third usage conditions for a third module of the SOC. The third usage conditions may correspond to a third operating frequency of the third module 116 and a third amount of time that that third module 116 operates at the third operating frequency. As a non-limiting example, referring to FIG. 2, the third usage conditions may specify that the third module 116 is predicted to operate at 450 MHz for eighteen hours during the single battery life of the wireless device.

Design parameters for the SOC may be determined, at 504. For example, referring to FIG. 1, the design processor 102 may determine the design parameters 108 for the SOC 110 to be designed based on the first usage conditions and the second usage conditions (e.g., based on the planned usage conditions 104). For example, the design processor 102 may determine the design parameters 108 based on the tradeoff between energy drain (caused by increasing transistor threshold voltages) and execution time. To illustrate, if the planned usage conditions 104 indicate a relatively short execution time for a particular module, the design processor 102 may determine to decrease the transistor threshold voltages for the particular module to conserve energy. In a particular embodiment, the design parameters 108 may also be based on the third usage conditions.

To illustrate, if the planned usage conditions 104 are based on the first user profile, the design parameters 108 (e.g., the transistor parameters) may be configured (e.g., "optimized") to design an SOC 110 used primarily for phone calls, emails, texting, and social media purposes. If the planned usage conditions 104 are based on the second user profile, the design parameters 108 may be configured (e.g., "optimized") to design an SOC 110 used primarily for games and music. Design parameters 108 based on the first user profile may be used to design a first version of a wireless device, and design parameters 108 based on the second user profile may be used to design a second version of the wireless device. Each version of the wireless device may include similar components/modules (e.g., each version may correspond to a similar model of the wireless device).

The method 500 of FIG. 5 may improve performance of the SOC 110 to be designed based on a predicted user experience. For example, by providing the planned usage conditions 104 to the design processor 102, the design processor 102 may determine design parameters 108 (e.g., transistor parameters) for the SOC 110 based on how long a user is likely to use a particular module 112-116 within the SOC 110 at a particular frequency. For example, the design processor 102 may generate the design parameters 108 based on first usage conditions (e.g., a first operating frequency of the CPU and the amount of time the CPU operates at the first operating frequency) and based on second usage conditions (e.g., a second operating frequency of the DSP and the amount of time the DSP operates at the second operating frequency). Generating the design parameters 108 based on the planned usage conditions 104 (e.g., the first usage conditions and the second usage conditions) may enable the design of different versions of a wireless device to increase energy efficiency based on an anticipated planned user experience.

In a particular embodiment, the usage conditions for each module may correspond to different bands of frequencies at different points of time based on use cases. As a non-limiting example, the first usage conditions may correspond to a first operating frequency of the first module 112 and a first amount of time that the first module 112 operates at the first operating frequency, a second operating frequency of the first module 112 and a second amount of time that the first module 112 operates at the second operating frequency, a third operating frequency of the first module 112 and a third amount of time that the first module 112 operates at the third operating frequency, etc.

Figure 6:
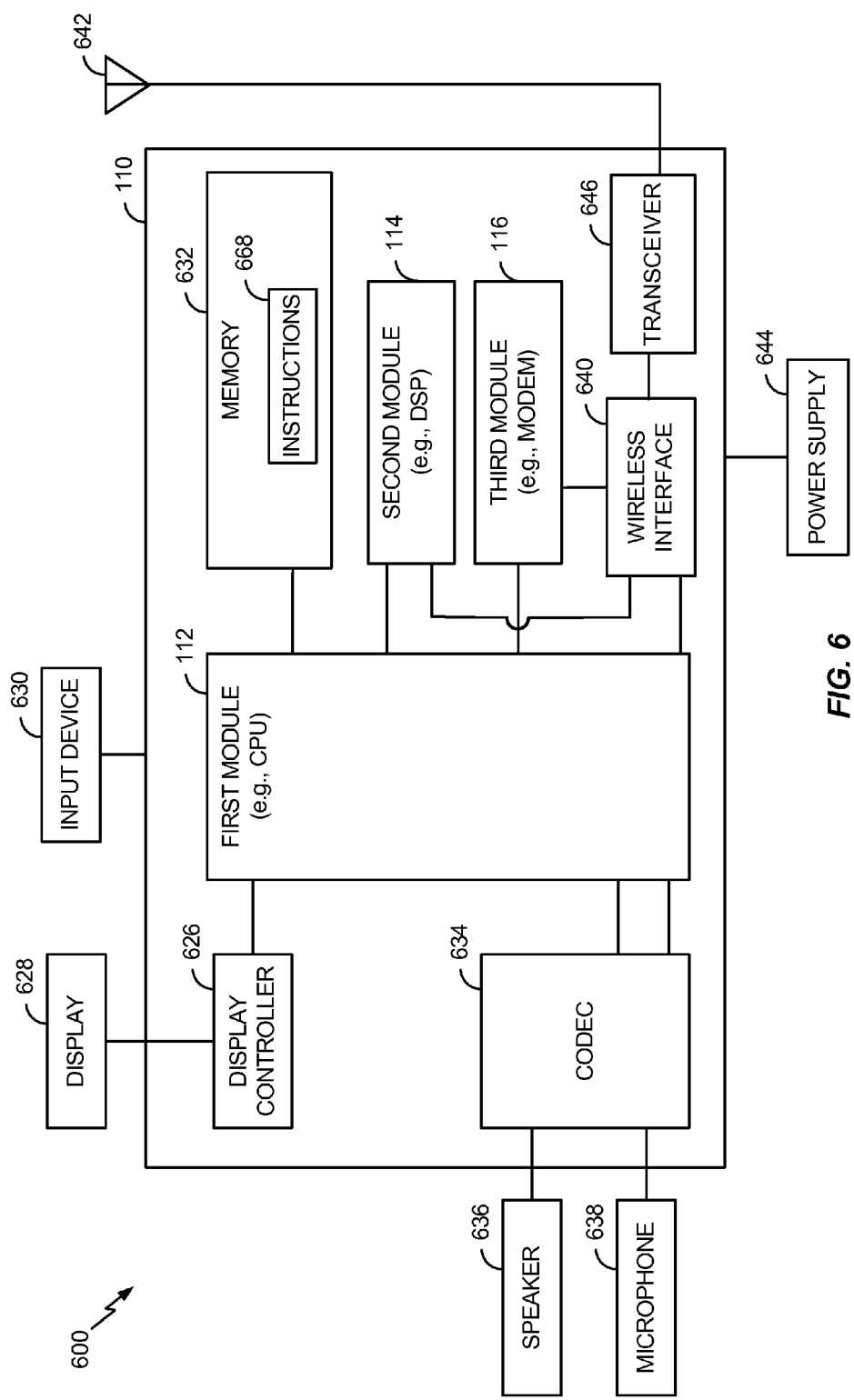
FIG. 6 is a block diagram of a device that includes an SOC designed based on techniques described with respect to FIGS. 1-5.

Referring to FIG. 6, a particular illustrative embodiment of a wireless communication device is depicted and generally designated 600. The device 600 includes the first module 112 (e.g., a CPU) coupled to a memory 632. The circuitry (e.g., the transistors) within the first module 112 may be designed according to the design parameters 108 determined by the design processor 102. The first module 112 may be configured to execute software (e.g., a program of one or more instructions 668) stored in the memory 632.

The second module 114 (e.g., a DSP) may be coupled to the first module 112. The circuitry (e.g., the transistors) within the second module 114 may be designed according to the design parameters 108 determined by the design processor 102. The third module 116 (e.g., a MODEM) may also be coupled to the first module 112. The circuitry within the third module 116 may be designed according to the design parameters determined by the design processor 102.

A wireless interface 640 may be coupled to the first module 112, to the second module 114, to the third module 116, and to an antenna 642. A coder/decoder (CODEC) 634 can also be coupled to the first module 112. A speaker 636 and a microphone 638 can be coupled to the CODEC 634. A display controller 626 can be coupled to the first module 112 and to a display device 628. In a particular embodiment, the first module 112, the second module 114, the third module 116, the display controller 626, the memory 632, the CODEC 634, and the wireless interface 640 are included in a system-in-package or SOC device. For example, the first module 112, the second module 114, the third module 116, the display controller 626, the memory 632, the CODEC 634, and the wireless interface 640 may be included in the SOC 110 of FIG. 1.

In a particular embodiment, an input device 630 and a power supply 644 are coupled to the SOC 110. Moreover, in a particular embodiment, as illustrated in FIG. 6, the display device 628, the input device 630, the speaker 636, the microphone 638, the antenna 642, and the power supply 644 are external to the SOC 110. However, each of the display device 628, the input device 630, the speaker 636, the microphone 638, the antenna 642, and the power supply 644 can be coupled to one or more components of the SOC 110, such as one or more interfaces or controllers.

Figure 7:
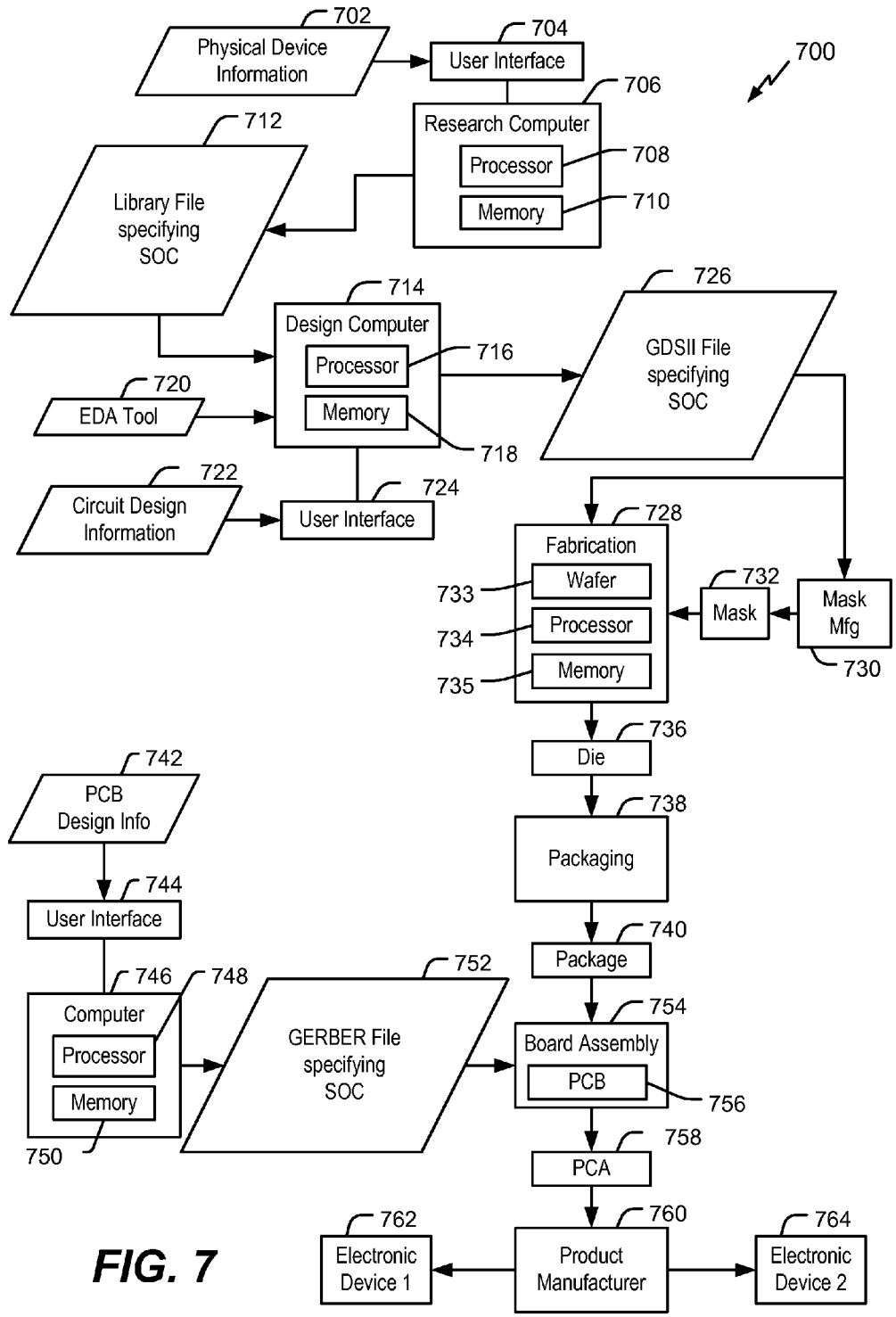
FIG. 7 is a data flow diagram of a particular illustrative embodiment of a manufacturing process to manufacture electronic devices an SOC designed based on techniques described with respect to FIGS. 1-5.

The foregoing disclosed devices and functionalities may be designed and configured into computer files (e.g., RTL, GDSII, GERBER, etc.) stored on computer-readable media. Some or all such files may be provided to fabrication handlers to fabricate devices based on such files. Resulting products include wafers that are then cut into dies and packaged into chips. The chips are then employed in devices described above. FIG. 7 depicts a particular illustrative embodiment of an electronic device manufacturing process 700.

Physical device information 702 is received at the manufacturing process 700, such as at a research computer 706. The physical device information 702 may include design information representing at least one physical property of a semiconductor device, such as a physical property of the SOC 110. For example, the physical device information 702 may include physical parameters, material characteristics, and structure information that is entered via a user interface 704 coupled to the research computer 706. The research computer 706 includes a processor 708, such as one or more processing cores, coupled to a computer-readable medium such as a memory 710. The memory 710 may store computer-readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices, including the SOC 110, provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design the SOC 110, using the library file 712. For example, a user of the design computer 714 may enter circuit design information 722 via a user interface 724 coupled to the design computer 714. The circuit design information 722 may include design information representing at least one physical property of a semiconductor device, such as the SOC 110. To illustrate, the circuit design property may include identification of particular circuits and relationships to other elements in a circuit design, positioning information, feature size information, interconnection information, or other information representing a physical property of an electronic device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the SOC 110, in addition to other circuits or information. To illustrate, the data file may include information corresponding to the SOC 110.

The GDSII file 726 may be received at a fabrication process 728 to manufacture a semiconductor device described with reference to FIGS. 1-6 according to transformed information in the GDSII file 726. For example, a device manufacture process may include providing the GDSII file 726 to a mask manufacturer 730 to create one or more masks, such as masks to be used with photolithography processing, illustrated in FIG. 7 as a representative mask 732. The mask 732 may be used during the fabrication process to generate one or more wafers 733, which may be tested and separated into dies, such as a representative die 736. The die 736 includes a circuit including the SOC 110.

In a particular embodiment, the fabrication process 728 may be initiated by or controlled by a processor 734. The processor 734 may access a memory 735 that includes executable instructions such as computer-readable instructions or processor-readable instructions. The executable instructions may include one or more instructions that are executable by a computer, such as the processor 734.

The fabrication process 728 may be implemented by a fabrication system that is fully automated or partially automated. For example, the fabrication process 728 may be automated and may perform processing steps according to a schedule. The fabrication system may include fabrication equipment (e.g., processing tools) to perform one or more operations to form an electronic device.

The fabrication system may have a distributed architecture (e.g., a hierarchy). For example, the fabrication system may include one or more processors, such as the processor 734, one or more memories, such as the memory 735, and/or controllers that are distributed according to the distributed architecture. The distributed architecture may include a high-level processor that controls or initiates operations of one or more low-level systems. For example, a high-level portion of the fabrication process 728 may include one or more processors, such as the processor 734, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component of the fabrication system may include a processor, such as the processor 734.

Alternatively, the processor 734 may be a part of a high-level system, subsystem, or component of the fabrication system. In another embodiment, the processor 734 includes distributed processing at various levels and components of a fabrication system.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged electronic device on a circuit board, the packaged electronic device corresponding to the package 740 including the SOC 110.

The computer 746 may be configured to transform the PCB design information 742 to generate a data file, such as a GERBER file 752 with data that includes physical positioning information of a packaged electronic device on a circuit board, as well as layout of electrical connections such as traces and vias, where the packaged electronic device corresponds to the package 740 including the SOC 110. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacturer 760 and integrated into one or more electronic devices, such as a first representative electronic device 762 and a second representative electronic device 764. As an illustrative, non-limiting example, the first representative electronic device 762, the second representative electronic device 764, or both, may be selected from a set top box, a music player, a video player, an entertainment unit, a navigation device, a communications device, a personal digital assistant (PDA), a fixed location data unit, and a computer, into which the SOC 110, is integrated. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to teachings of the disclosure, the disclosure is not limited to these illustrated units. Embodiments of the disclosure may be suitably employed in any device which includes active integrated circuitry including memory and on-chip circuitry.

A device that includes the SOC 110, may be fabricated, processed, and incorporated into an electronic device, as described in the illustrative manufacturing process 700. One or more aspects of the embodiments disclosed with respect to FIGS. 1-5 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. The process 700 of FIG. 7 may be performed by a single entity or by one or more entities performing various stages of the manufacturing process 700.

In conjunction with the described aspects, an apparatus includes means for receiving first usage conditions for a first module of a SOC for a wireless device and second usage conditions for a second module of the SOC. For example, the means for receiving the first usage conditions and the second usage conditions may include the design processor 102 of FIGS. 1 and 4 and/or one or more components of the manufacturing equipment in FIG. 7.

The apparatus also includes means for determining design parameters for the SOC. The design parameters are based on the first usage conditions and the second usage conditions. For example, the means for determining the design parameters may include the design processor 102 of FIGS. 1 and 4 and/or one or more components of the manufacturing equipment in FIG. 7.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g. tangible) storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method for designing a system-on-chip (SOC) for a wireless device, the method comprising:

receiving, at a design processor, first usage conditions for a first module of the SOC and second usage conditions for a second module of the SOC; and determining design parameters for the SOC based on the first usage conditions and the second usage conditions.

2. The method of claim 1, wherein the first usage conditions correspond to a first operating frequency of the first module and a first amount of time that the first module operates at the first operating frequency.

3. The method of claim 2, wherein the second usage conditions correspond to a second operating frequency of the second module and a second amount of time that the second module operates at the second operating frequency.

4. The method of claim 1, wherein the first usage conditions correspond to a first operating frequency of the first module and a first amount of time that the first module operates at the first operating frequency, a second operating frequency of the first module and a second amount of time that the first module operates at the second operating frequency, and a third operating frequency of the first module and a third amount of time that the first module operates at the third operating frequency.

5. The method of claim 1, wherein the design parameters indicate transistor device architectures, electrical property tuning, or any combination thereof.

6. The method of claim 1, wherein the design parameters indicate transistor threshold voltages, transistor channel lengths, or any combination thereof.

7. The method of claim 1, further comprising receiving third usage conditions for a third module of the SOC, wherein the design parameters are determined further based on the third usage conditions, wherein the third usage conditions correspond to a third operating frequency of the third module and a third amount of time that the third module operates at the third operating frequency.

8. The method of claim 1, wherein the first usage conditions and the second usage conditions are based on a user profile of the wireless device.

9. The method of claim 1, wherein the first module corresponds to a central processing unit (CPU), a digital signal processor (DSP), a graphics processing unit (GPU), a modulator/demodulator (MODEM), or a display module, and wherein the second module corresponds to a CPU, a DSP, a GPU, a MODEM, or a display module.

10. The method of claim 1, wherein the first usage conditions and the second usage conditions are based on one or more predicted uses of the wireless device.

11. The method of claim 1, wherein the first usage conditions correspond to a first operating frequency of the first module and a first amount of time that the first module operates at the first operating frequency and a second operating frequency of the first module and a second amount of time that the first module operates at the second operating frequency.

12. The method of claim 1, wherein the design parameters indicate transistor fin width, transistor contact poly pitch, or any combination thereof.

13. An apparatus comprising:
a processor; and a memory storing instructions executable by the processor to perform operations comprising:
receiving first usage conditions for a first module of a system-on-chip (SOC) for a wireless device and second usage conditions for a second module of the SOC; and
determining design parameters for the SOC based on the first usage conditions and the second usage conditions.

14. The apparatus of claim 13, wherein the first usage conditions correspond to a first operating frequency of the first module and a first amount of time that the first module operates at the first operating frequency, and wherein the second usage conditions correspond to a second operating frequency of the second module and a second amount of time that the second module operates at the second operating frequency.

15. The apparatus of claim 13, wherein the first usage conditions correspond to a first operating frequency of the first module and a first amount of time that the first module operates at the first operating frequency, a second operating frequency of the first module and a second amount of time that the first module operates at the second operating frequency, and a third operating frequency of the first module and a third amount of time that the first module operates at the third operating frequency.

16. The apparatus of claim 13, wherein the design parameters indicate transistor device architectures, electrical property tuning, or any combination thereof.

17. The apparatus of claim 13, wherein the design parameters indicate transistor threshold voltages, transistor channel lengths, or any combination thereof.

18. A non-transitory computer-readable medium comprising instructions for designing a system-on-chip (SOC) for a wireless device, wherein the instructions, when executed by a design processor, cause the design processor to:
receive first usage conditions for a first module of the SOC and second usage conditions for a second module of the SOC; and
determine design parameters for the SOC based on the first usage conditions and the second usage conditions.

19. The non-transitory computer-readable medium of claim 18, wherein the first usage conditions correspond to a first operating frequency of the first module and a first amount of time that the first module operates at the first operating frequency, and wherein the second usage conditions correspond to a second operating frequency of the second module and a second amount of time that the second module operates at the second operating frequency.

20. The non-transitory computer-readable medium of claim 18, wherein the first usage conditions correspond to a first operating frequency of the first module and a first amount of time that the first module operates at the first operating frequency, a second operating frequency of the first module and a second amount of time that the first module operates at the second operating frequency, and a third operating frequency of the first module and a third amount of time that the first module operates at the third operating frequency.

* * * * *